United States Patent
Ciccaglione

(10) Patent No.: US 7,646,605 B2
(45) Date of Patent: Jan. 12, 2010

(54) ELECTRONIC MODULE PACKAGING

(75) Inventor: Terry M. Ciccaglione, Cold Spring, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 11/848,260

(22) Filed: Aug. 31, 2007

(65) Prior Publication Data

US 2009/0059529 A1   Mar. 5, 2009

(51) Int. Cl.
    *H05K 7/20* (2006.01)
(52) U.S. Cl. ............ 361/704; 361/679.01; 361/679.02; 206/714; 206/719; 206/723
(58) Field of Classification Search ................. 361/679, 361/689, 704, 714, 727, 679.01, 679.02; 206/521–523, 329, 524.4, 701, 707, 714–729; 156/47; 174/50; 383/109, 127
    See application file for complete search history.

(56) References Cited

U.S. PATENT DOCUMENTS

| | | | | | |
|---|---|---|---|---|---|
| 3,653,498 | A | * | 4/1972 | Kisor | 206/728 |
| 4,026,412 | A | * | 5/1977 | Henson | 206/728 |
| 4,231,901 | A | * | 11/1980 | Berbeco | 252/511 |
| 4,241,829 | A | * | 12/1980 | Hardy | 206/709 |
| 4,301,040 | A | * | 11/1981 | Berbeco | 252/511 |
| 4,327,832 | A | * | 5/1982 | de Matteo | 206/718 |
| 4,427,114 | A | * | 1/1984 | Howell et al. | 206/707 |
| 4,471,872 | A | * | 9/1984 | Dedow | 206/720 |
| 4,564,880 | A | * | 1/1986 | Christ et al. | 361/212 |
| 4,736,841 | A | * | 4/1988 | Kaneko et al. | 206/714 |
| 4,767,003 | A | * | 8/1988 | Rice et al. | 206/719 |
| 4,815,596 | A | * | 3/1989 | Reid | 206/719 |
| 4,848,566 | A | * | 7/1989 | Havens et al. | 206/719 |
| 4,889,750 | A | * | 12/1989 | Wiley | 428/34.2 |
| 5,000,697 | A | * | 3/1991 | Murphy | 439/331 |
| 5,012,924 | A | * | 5/1991 | Murphy | 206/719 |
| 5,109,981 | A | * | 5/1992 | Maston et al. | 206/719 |
| 5,136,827 | A | * | 8/1992 | Sawaya | 53/453 |
| 5,163,551 | A | * | 11/1992 | Bhatia | 206/725 |
| 5,232,091 | A | * | 8/1993 | Hennessy et al. | 206/713 |
| 5,360,110 | A | * | 11/1994 | Hirai et al. | 206/714 |
| 5,402,885 | A | * | 4/1995 | Cook et al. | 206/723 |
| 5,405,000 | A | * | 4/1995 | Hagedon et al. | 206/216 |
| 5,447,784 | A | * | 9/1995 | Williams et al. | 428/220 |
| 5,477,966 | A | * | 12/1995 | Ogawa | 206/723 |
| 5,518,120 | A | * | 5/1996 | Ahlm et al. | 206/719 |
| 5,567,177 | A | * | 10/1996 | Foerstel et al. | 439/526 |
| 5,641,068 | A | * | 6/1997 | Warner | 206/523 |
| 5,664,680 | A | * | 9/1997 | Hamlin | 206/714 |
| 5,673,795 | A | * | 10/1997 | Clatanoff et al. | 206/719 |
| 5,875,897 | A | * | 3/1999 | Duncan et al. | 206/714 |

(Continued)

*Primary Examiner*—Michael V Datskovskiy
(74) *Attorney, Agent, or Firm*—Cantor Colburn LLP; Steven Bennett

(57) ABSTRACT

An electronic module packaging system and an electronic module packaging apparatus are disclosed. The electronic module packaging system includes an exterior packing box, an electronic module packaging apparatus, and antistatic packing foam holding the electronic module packaging apparatus within the exterior packing box. The electronic module packaging apparatus includes a top component made of an antistatic material, and a bottom component made of a conductive material. The bottom component includes multiple support members to hold an electronic module in a stable position. The top component and the bottom component may be coupled with multiple securing clips.

20 Claims, 4 Drawing Sheets

U.S. PATENT DOCUMENTS

| | | | |
|---|---|---|---|
| 5,881,883 A * | 3/1999 | Siegelman | 206/720 |
| 5,964,353 A * | 10/1999 | Hamlin | 206/714 |
| 6,116,423 A * | 9/2000 | Troxtell et al. | 206/523 |
| 6,827,218 B1 * | 12/2004 | Dick et al. | 206/720 |
| 6,938,783 B2 * | 9/2005 | Chung | 211/41.18 |
| 7,093,717 B2 * | 8/2006 | Sakai et al. | 206/591 |
| 7,364,778 B2 * | 4/2008 | Miyakawa et al. | 428/35.7 |
| 7,455,896 B2 * | 11/2008 | Fujimura et al. | 428/35.7 |
| 7,503,109 B2 * | 3/2009 | Kawada | 29/832 |
| 2003/0121928 A1 * | 7/2003 | Chou | 220/844 |
| 2003/0150770 A1 * | 8/2003 | Campbell et al. | 206/722 |

* cited by examiner

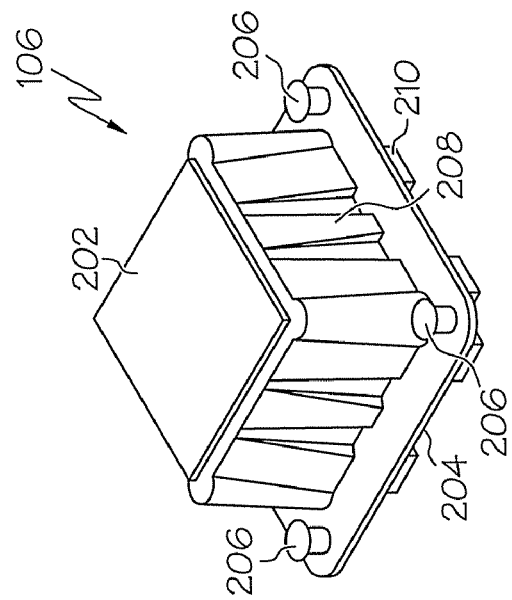
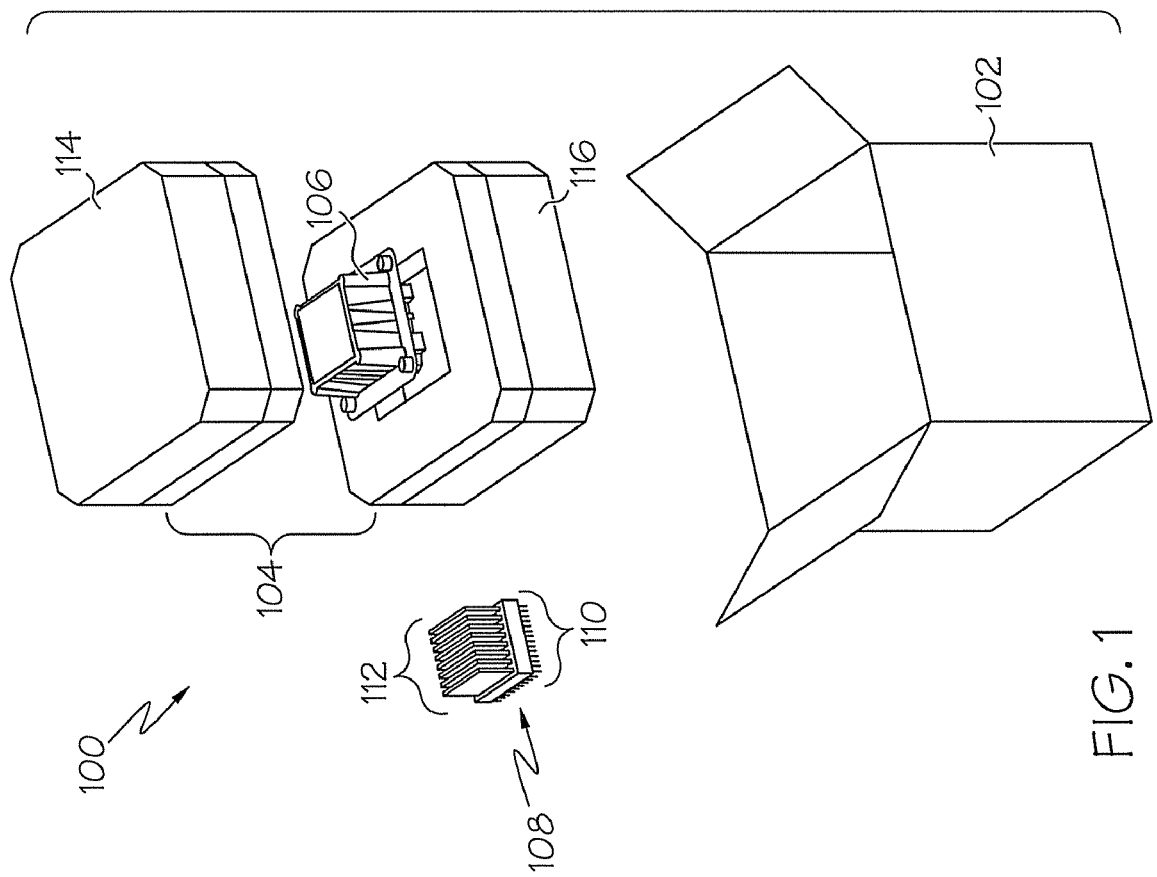

ELECTRONIC MODULE PACKAGING

BACKGROUND OF THE INVENTION

The present disclosure relates generally to electronics packaging, and, in particular, to low-cost packaging systems and apparatuses for shipment and storage of electronic modules.

As manufacturers have sought to create highly integrated electronic modules, for example multi-chip modules (MCMs), difficulties in developing packaging to ship and store such electronic modules have arisen. Complex microelectronic circuits and electronic contact pins can be extremely sensitive to environmental effects, such as electrostatic discharge (ESD) and jostling occurring during shipment. To support maintenance and upgrades of electronics in the field, e.g., a computer system at any worldwide customer location, customized packaging may be employed that is designed to reduce the risk of damage to an electronic module in transit and while stored in inventory. High-end electronic modules, costing tens of thousands of dollars per module, are typically packaged for shipment and storage in elaborate packaging, such as a metallic carrying case packed with custom cut foam inserts form fitted to an interior tray holding the electronic module in place. While such elaborate packaging systems may appear impressive, they are often heavy and complex to manufacture, resulting in high manufacturing, shipping, and storage costs. The interior tray typically makes contact with the electronic contact pins of the electronic module, which can lead to pin damage on insertion and removal of the electronic module. Additionally, relying on direct contact between large foam blocks and the electronic module for stability may result in damage if the package is dropped or inverted during shipping.

In order meet the environmental requirements for shipping electronic modules with minimal risk of damage, improved packaging designs are needed. Moreover, such designs should be inexpensive relative to the value of the contents shipped within the packaging, thus increasing profitability. Accordingly, there is a need in the art for low-cost electronic module packaging systems and apparatuses.

BRIEF SUMMARY OF THE INVENTION

Embodiments of the invention include an electronic module packaging apparatus. The electronic module packaging apparatus includes a top component made of an antistatic material and a bottom component made of a conductive material. The bottom component includes multiple support members to hold an electronic module in a stable position. The top and bottom components may be coupled with multiple securing clips.

Additional embodiments include an electronic module packaging system. The electronic module packaging system includes an exterior packing box, an electronic module packaging apparatus, and antistatic packing foam holding the electronic module packaging apparatus within the exterior packing box. The electronic module packaging apparatus includes a top component made of an antistatic material and a bottom component made of a conductive material. The bottom component includes multiple support members to hold an electronic module in a stable position. The top component and the bottom component may be coupled with multiple securing clips.

Other apparatuses and/or systems according to embodiments will be or become apparent to one with skill in the art upon review of the following drawings and detailed description. It is intended that all such additional apparatuses and/or systems be included within this description, be within the scope of the present invention, and be protected by the accompanying claims.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 is a perspective view of an electronic module packaging system in accordance with exemplary embodiments;

FIG. 2 is a perspective view of an electronic module packaging apparatus in accordance with exemplary embodiments;

Figure 3:
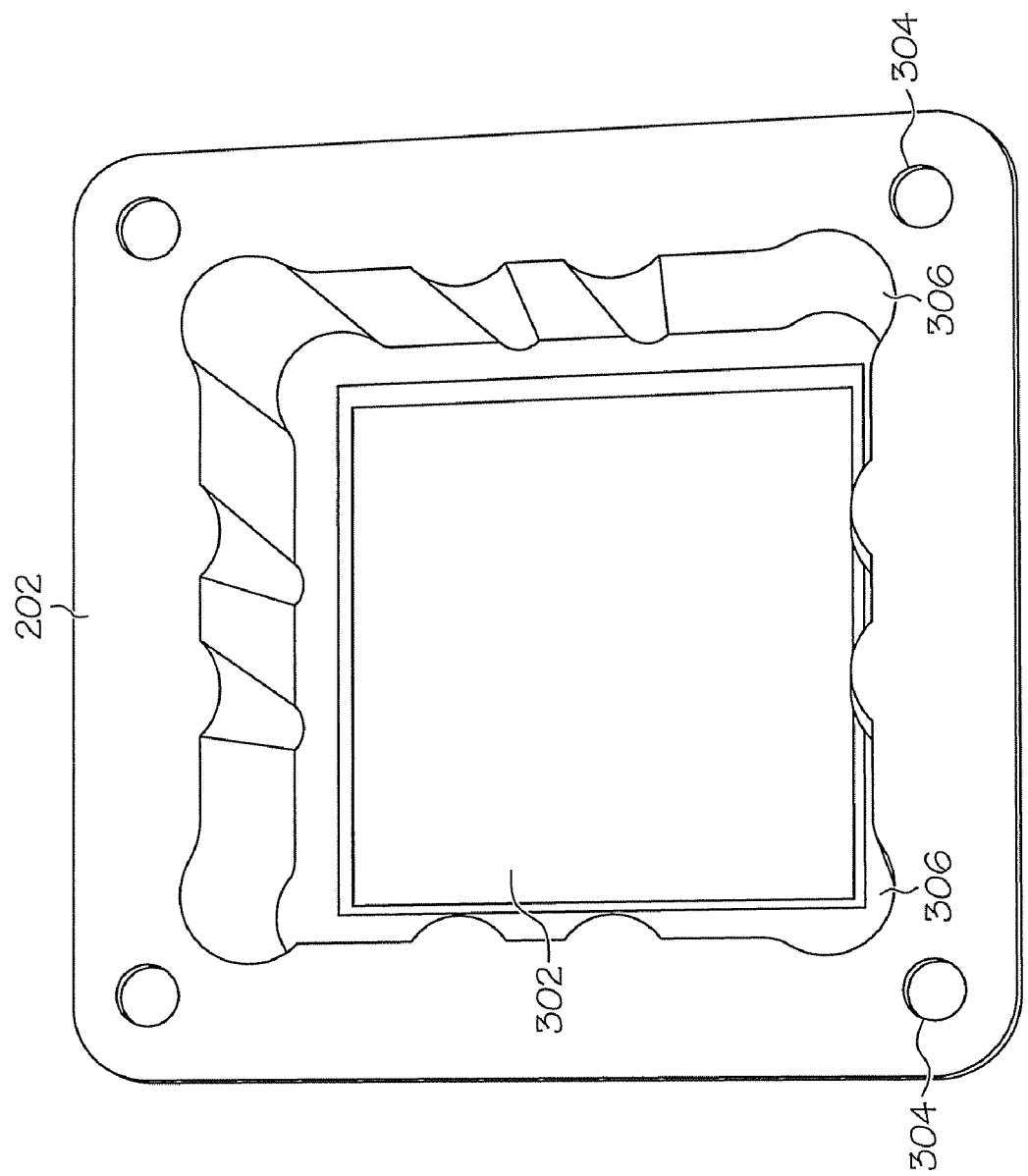
FIG. 3 is a bottom view of a top component of an electronic module packaging apparatus in accordance with exemplary embodiments FIG. 4. is a top view of a bottom component of an electronic module packaging apparatus in accordance with exemplary embodiments.

The detailed description explains the preferred embodiments of the invention, together with advantages and features, by way of example with reference to the drawings.

DETAILED DESCRIPTION OF THE INVENTION

Disclosed herein are low-cost packaging systems and apparatuses for shipment and storage of electronic modules. Modern electronic modules, such as microprocessors, are susceptible to both electrical damage and physical damage if they are not handled with due care. For example, an electronic module can be electrically damaged by a discharge of static electricity and physically damaged when electronic contact pins are bent or broken. Electronic modules that run at high frequencies and/or consume large amounts of power can dissipate a substantial amount of energy in the form of heat. Thus, electronic modules may include integrated heat sink fins, or ship with a heat sink attached on top of each electronic module for ease of installation in a larger computer system. Heat sink fins, whether integrated as part of an electronic module or included as an attached heat sink, can be physically damaged during shipment. Therefore, the heat sink fins must also be protected during shipment to maintain proper thermal performance when the electronic module is powered.

An electronic module may appear as a square or rectangular object, with electronic contact pins extending below and heat sink fins extending above. In exemplary embodiments, an electronic module packaging system includes an exterior packing box, packing foam, and an electronic module packaging apparatus. The electronic module packaging apparatus includes a top component and a bottom component that provide stability support for holding the electronic module in a fixed position, while minimizing the risk of damage due to static electricity discharge. The electronic module packaging apparatus may include support for heat sink fins on top of the electronic module and provide perimeter support for locking the electronic module in place without applying pressure to the bottom of the electronic contact pins. Further details of the electronic module packaging system and apparatus, as well as alternate embodiments, are provided herein.

Turning now to FIG. 1, a perspective view of an electronic module packaging system 100 is depicted in accordance with exemplary embodiments. The electronic module packaging system 100 includes an exterior packing box 102, packing foam 104, and an electronic module packaging apparatus 106 for holding an electronic module 108. The exemplary electronic module 108 depicted in FIG. 1 includes multiple electronic contact pins 110 extending below the electronic module 108, and multiple heat sink fins 112 extending above the electronic module 108. The heat sink fins 112 may be integrated as part of the electronic module 108 or may be part of a separate heat sink attached to the electronic module 108. The electronic module 108 represents merely one example of the type of contents that may be stored within the electronic module packaging apparatus 106 and the electronic module packaging system 100. In exemplary embodiments, the exterior packing box 102 is made of corrugated fiberboard. The use of corrugated fiberboard may provide advantages such as structural stability, low weight, ease of manufacture, and low cost, while using a recyclable material.

The packing foam 104 may include a single piece or multiple pieces of foam, such as a top foam block 114 and a bottom foam block 116. In exemplary embodiments, the packing foam 104 is antistatic foam, e.g., pink foam, to prevent static charge buildup during packing, shipping, and handling of the electronic module packaging system 100. Antistatic materials have a higher surface resistivity (Ohms/sq) than conductive materials, allowing slow charge decay to reduce the risk of electrostatic discharge (ESD) damaging events. Antistatic materials may prevent high leakage currents from being conducted between metal contacts on the surface of a part, as well as preventing buildup of an initial charge. Conductive materials, with a lower surface resistivity, allow for rapid charge decay but can damage sensitive parts if placed in contact with a high charge.

In exemplary embodiments, the electronic module packaging apparatus 106 includes a combination of antistatic and conductive materials to both prevent buildup of an initial charge during movement of the electronic module packaging apparatus 106 and to quickly dissipate any charge when the apparatus 106 is placed on an ESD-safe surface, e.g., a conductive ESD-safe workbench. For example, upon receiving the electronic module packaging system 100, a worker in an ESD controlled environment would likely open the electronic module packaging system 100, remove the electronic module packaging apparatus 106 from the packing foam 104, and place the electronic module packaging apparatus 106 on a conductive workbench for inspection, dissipating any charge before opening the electronic module packaging apparatus 106 to extract the contents (e.g., the electronic module 108).

While the configuration of the electronic module packaging system 100 depicted in FIG. 1 includes a single electronic module packaging apparatus 106, the scope of the invention is not so limited. To the contrary, there may be any number of electronic module packaging apparatuses 106 included within the electronic module packaging system 100, e.g., four electronic module packaging apparatuses 106 within the exterior packing box 102. Moreover, the dimensions of the electronic module packaging system 100 can vary depending upon the number of electronic module packaging apparatuses 106 and the desired amount of packing foam 104 surrounding each electronic module packaging apparatus 106. For example, an electronic module packaging system 100 holding a single electronic module packaging apparatus 106 may be approximately one foot square. Similar to the exterior packing box 102, the electronic module packaging apparatus 106 may be made of lightweight and low cost recyclable materials to minimize weight, cost, and waste.

Turning now to FIG. 2, a perspective view of the electronic module packaging apparatus 106 in accordance with exemplary embodiments is depicted. The electronic module packaging apparatus 106 includes a top component 202 and a bottom component 204. In exemplary embodiments, the top component 202 is made of an antistatic material (e.g., antistatic plastic), while the bottom component 204 is made of a conductive material (e.g., conductive plastic). The bottom component 204 serves as a tray for holding the electronic module 108 of FIG. 1, with the top component 202 providing a cover for the tray, e.g. a clamshell design. In exemplary embodiments, the top component 202 is clear, enabling visual inspection of contents of the electronic module packaging apparatus 106 while closed. The top component 202 and the bottom component 204 may be coupled using any number of fasteners, such as securing clips 206. In exemplary embodiments, four nylon securing clips 206, one per corner, are used to hold the top and bottom components 202 and 204 together. Structural stability of the top component 202 may be enhanced through tapering of side members 208 of the top component 202, from narrower to wider as viewed from top to bottom, i.e. a larger diameter at the bottom than the top of the top component 202. In exemplary embodiments, side members 210 of the bottom component 204 are indented to form support members for holding the electronic module 108 of FIG. 1 in place. Further details of the top component 202 and the bottom component 204 of the electronic module packaging apparatus 106 are provided herein.

Turning now to FIG. 3, a bottom view of the top component 202 of the electronic module packaging apparatus 106 is depicted in accordance with exemplary embodiments. In exemplary embodiments, the top component 202 includes a foam insert 302 attached to the interior surface of the top of the top component 202. The foam insert 302 may be conductive and provide an anchor point for contents placed within the electronic module packaging apparatus 106. For example, when the electronic module 108 of FIG. 1 is placed in the bottom component 204 (tray), the heat sink fins 112 extending above the electronic module 108 are anchored in place by making contact with the foam insert 302 when the top component 202 covers the bottom component 204. The foam insert 302 can be attached to the interior surface of the top of the top component 202 using glue or an alternate adhesive. While a single foam insert 302 is depicted, multiple single foam inserts 302 may be used (e.g., multiple foam strips), providing multiple anchor points for contents placed within the electronic module packaging apparatus 106.

In exemplary embodiments, the top component 202 includes multiple through-holes 304. The through-holes 304 provide coupling points for fasteners, such as the securing clips 206 of FIG. 2, to pass through for securing the top component 202 to the bottom component 204. The top component 202 may also include base corner pockets 306. The base corner pockets 306 supply an opening to ease placement and removal of the electronic module 108 of FIG. 1 within the top component 202. For example, when the electronic module packaging apparatus 106 is received containing the electronic module 108, the electronic module packaging apparatus 106 can be placed inverted on a horizontal workbench and the bottom component 204 removed, such that the electronic module 108 is supported by the heat sink fins 112 pressed against the foam insert 302. This upside down position enables inspection of the electronic contact pins 110 of the electronic module 108 while the electronic module 108 remains in the top component 202. A worker may insert his fingers or tools in the openings provided by the base corner pockets 306 to extract the electronic module 108 from the top component 202.

Figure 4:
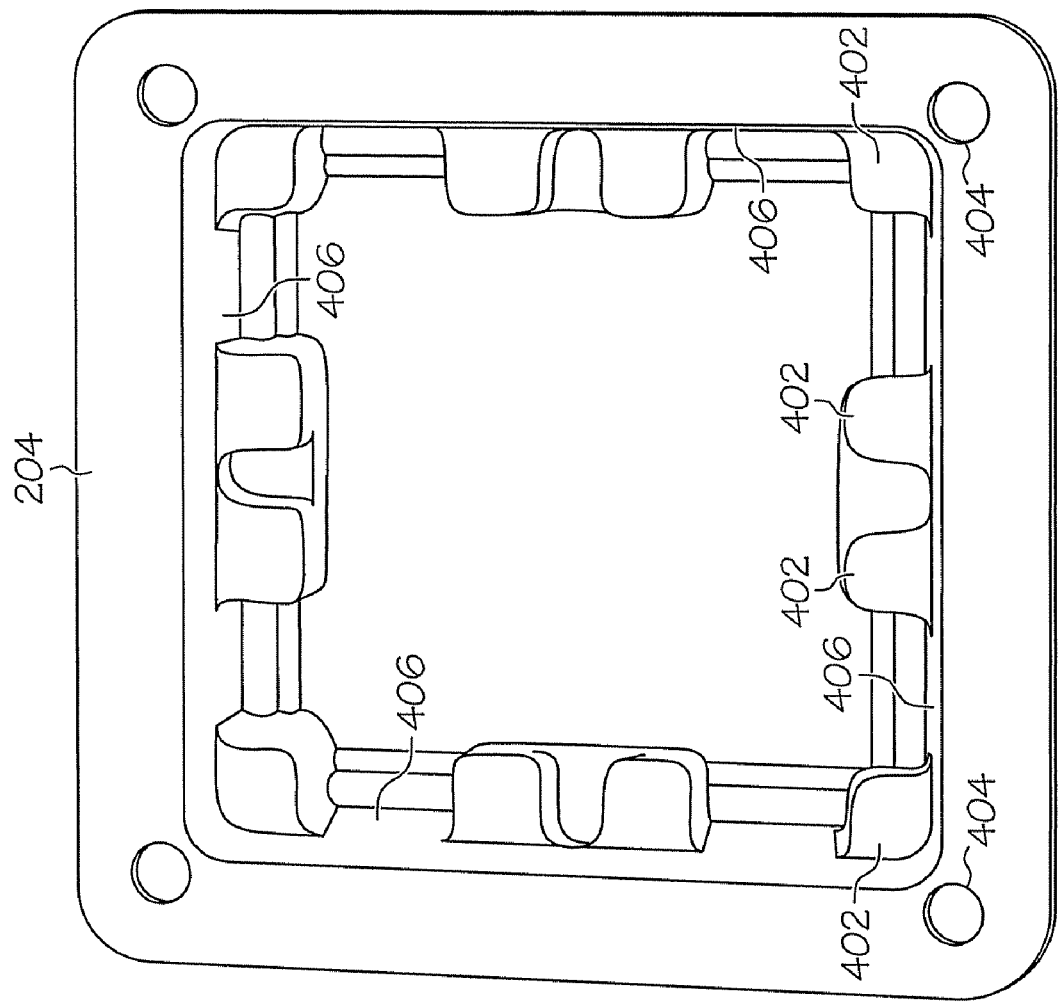

Turning now to FIG. 4, a top view of the bottom component 204 of the electronic module packaging apparatus 106 is depicted in accordance with exemplary embodiments. The bottom component 204 includes multiple support members 402, which may be formed as indentations of the side members 210 of FIG. 2. The support members 402 may be recessed from the upper edge of the bottom component 204 to allow space for seating the electronic module 108 on top of the support members 402. The recessed space from the upper edge of the bottom component 204 down to the support members 402 serves as perimeter base supports 406, which may assist in holding the electronic module 108 in a stable position. When the electronic module 108 is placed in the bottom component 204, the support members 402 make contact with the bottom edges (perimeter) of the electronic module 108 with the perimeter base supports 406 of the bottom component 204 making contact with the exterior edges of the module 108.

As previously described, the bottom component 204 serves as a tray for holding the electronic module 108, with the electronic contact pins 110 oriented downward towards the bottom of the bottom component 204. The height of the support members 402 may be such that a gap space 502 exists between the bottom of the electronic contact pins 110 and the interior surface of the bottom component 204, as depicted in the cross sectional view of FIG. 5. The gap space 502 may be sized such that the electronic contact pins 110 of the electronic module 108 do not make contact with the bottom component 204 under nominal loading conditions. Thus, the risk of damage to the electronic contact pins 110, including bent and broken pins, is significantly reduced even when the electronic module packaging apparatus 106 is moved about.

Figure 5:
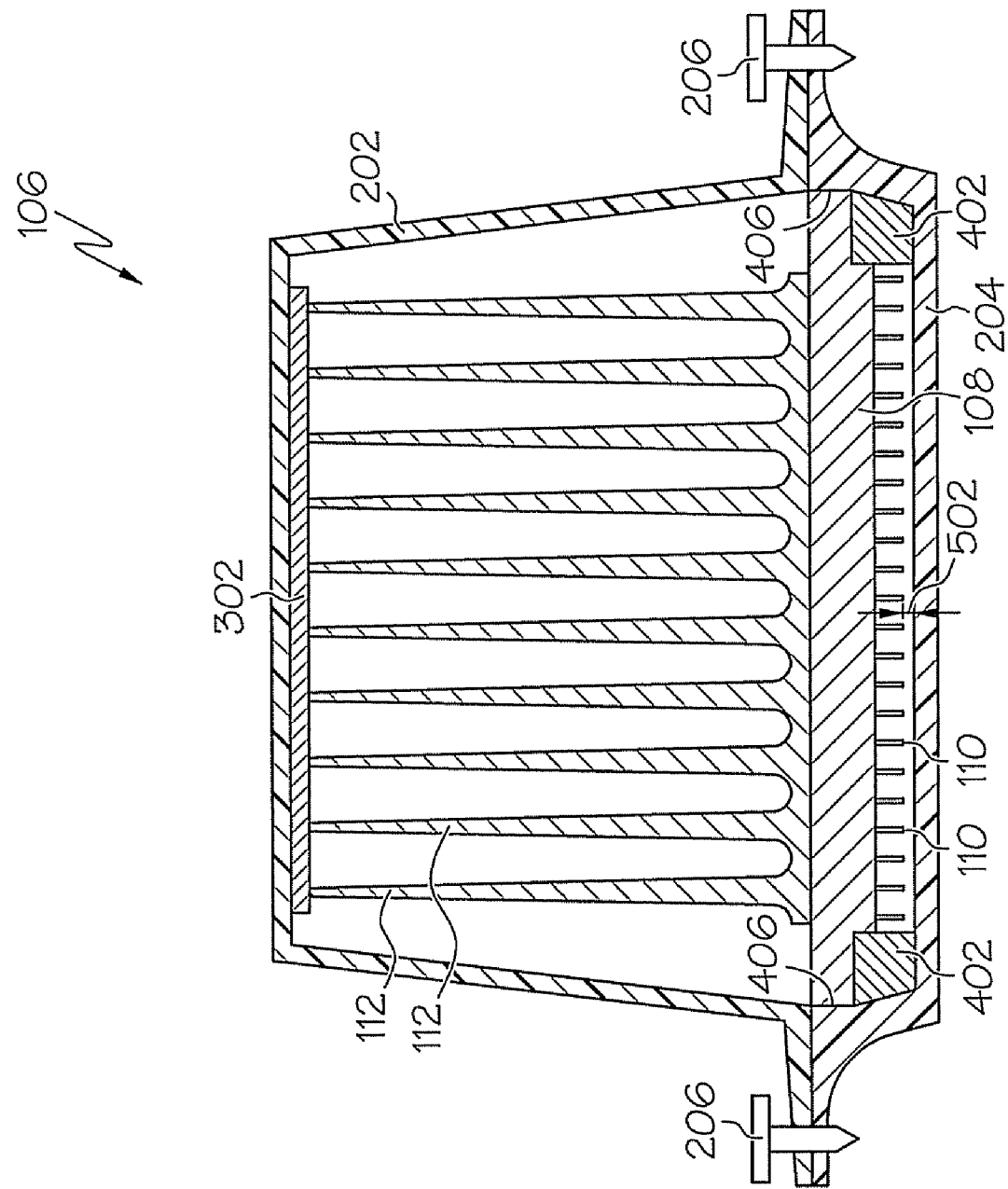
FIG. 5 is a cross-sectional view of an electronic module packaging apparatus holding an electronic module in accordance with exemplary embodiments.

Multiple support and stabilization features are combined to protect the electronic module 108. The support members 402 work in conjunction with the perimeter base supports 406 to lock the electronic module 108 in position. In exemplary embodiments, the bottom component 204 also includes multiple through-holes 404 as depicted in FIG. 4. The through-holes 404 provide coupling points for fasteners, such as the securing clips 206, when aligned with the through-holes 304 of FIG. 3 for securing the top component 202 to the bottom component 204. Further support for the electronic module 108 is provided by the foam insert 302, which anchors the heat sink fins 112 extending above the electronic module 108 when the top and bottom components 202 and 204 are coupled together with the securing clips 206, as depicted in FIG. 5. The combined supports minimize potential physical damage that could otherwise occur to the heat sink fins 112 and the electronic contact pins 110. Additionally, the use of both antistatic and conductive materials in the electronic module packaging apparatus 106 reduces the risk of damage due to ESD.

Although the invention has been described in terms of packaging for the electronic module 108 with electronic contact pins 110 below and heat sink fins 112 above, the scope of the invention is not so limited. For example, the electronic module 108 can use any type of electronic connector technology known in the art, such as a land grid array (LGA), a ball grid array (BGA), pin grid array (PGA), and the like. Moreover, the electronic module 108 need not include the heat sink fins 112 or a heat sink to benefit from disclosed the electronic module packaging system 100 and apparatus 106. The use of materials such as plastic, foam, and corrugated fiberboard may provide further advantages, including rapid design and manufacturing time, resulting in low-cost compact packaging.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. An electronic module packaging apparatus, comprising:
   a top component comprised of an antistatic material, the top component including multiple through-holes; and
   a bottom component comprised of:
   a conductive material, the antistatic material having a higher surface resistivity than the conductive material;
   a plurality of support members to hold an electronic module in a stable position, the support members formed as protrusions of side members at each midpoint and corner of the bottom component; and
   multiple through-holes to couple the top and bottom components with multiple securing clips passing through the through-holes of the top and bottom components.

2. The apparatus of claim 1 wherein the top component and the bottom component are coupled via a plurality of nylon securing clips.

3. The apparatus of claim 1 wherein the top component includes a conductive foam insert providing an anchor point for contents placed within the electronic module packaging apparatus, the conductive foam insert attached to the interior of the top component using an adhesive.

4. The apparatus of claim 3 wherein the top component and the bottom component are sized to fit the electronic module when the electronic module includes heat sink fins, and further wherein the heat sink fins are placed in contact with the anchor point when the top component and bottom component are coupled via a plurality of securing clips.

5. The apparatus of claim 1 wherein the top component includes side members that are tapered narrower to wider from top to bottom.

6. The apparatus of claim 1 wherein the top component is comprised of clear plastic, enabling visual inspection of contents within the electronic module packaging apparatus.

7. The apparatus of claim 1 wherein the support members hold edges of the electronic module while providing gap space for electronic contact pins of the electronic module.

8. The apparatus of claim 7 wherein the gap space is sized such that the electronic contact pins of the electronic module do not make contact with the bottom component under nominal loading conditions.

9. The apparatus of claim 1 wherein the top component includes a plurality of base corner pockets to provide openings to grip contents of the electronic module packaging apparatus, and the bottom component includes a plurality of base perimeter supports to assist in holding the electronic module in a stable position.

10. An electronic module packaging system comprising:
an exterior packing box;
an electronic module packaging apparatus comprised of:
a top component comprised of an antistatic material, the top component including multiple through-holes; and
a bottom component comprised of:
a conductive material, the antistatic material having a higher surface resistivity than the conductive material;
a plurality of support members to hold an electronic module in a stable position, the support members formed as protrusions of side members at each midpoint and corner of the bottom component; and
multiple through-holes to couple the top and bottom components with multiple securing clips passing through the through-holes of the top and bottom components; and
antistatic packing foam holding the electronic module packaging apparatus within the exterior packing box.

11. The system of claim 10 wherein the exterior packing box is comprised of corrugated fiberboard.

12. The system of claim 10 wherein the antistatic packing foam is comprised of a plurality of blocks.

13. The system of claim 10 wherein the securing clips are made of nylon.

14. The system of claim 10 wherein the top component of the electronic module packaging apparatus includes a conductive foam insert providing an anchor point for contents placed within the electronic module packaging apparatus, the conductive foam insert attached to the interior of the top component using an adhesive.

15. The system of claim 14 wherein the top component and the bottom component of the electronic module packaging apparatus are sized to fit the electronic module when the electronic module includes heat sink fins, and further wherein the heat sink fins are placed in contact with the anchor point.

16. The system of claim 10 wherein the top component of the electronic module packaging apparatus includes side members that are tapered narrower to wider from top to bottom.

17. The system of claim 10 wherein the top component of the electronic module packaging apparatus is comprised of clear plastic, enabling visual inspection of contents within the electronic module packaging apparatus.

18. The system of claim 10 wherein the support members hold edges of the electronic module while providing gap space for electronic contact pins of the electronic module.

19. The system of claim 18 wherein the gap space is sized such that the electronic contact pins of the electronic module do not make contact with the bottom component of the electronic module packaging apparatus under nominal loading conditions.

20. The system of claim 10 wherein the top component of the electronic module packaging apparatus includes a plurality of base corner pockets to provide openings to grip contents of the electronic module packaging apparatus, and the bottom component includes a plurality of base perimeter supports to assist in holding the electronic module in a stable position.

* * * * *